(12) United States Patent
Dayal et al.

(10) Patent No.: US 9,074,922 B2
(45) Date of Patent: Jul. 7, 2015

(54) SYSTEMS AND METHODS FOR REMOTELY MEASURING A LIQUID LEVEL USING TIME-DOMAIN REFLECTOMETRY (TDR)

(71) Applicants: Yogeshwar Dayal, San Jose, CA (US); William Francis Splichal, San Jose, CA (US); Steven D. Sawyer, San Jose, CA (US); Eric Rankin Gardner, Wilmington, NC (US); Bruce J. Lentner, Wilmington, NC (US); Philip O. Eisermann, Wilmington, NC (US)

(72) Inventors: Yogeshwar Dayal, San Jose, CA (US); William Francis Splichal, San Jose, CA (US); Steven D. Sawyer, San Jose, CA (US); Eric Rankin Gardner, Wilmington, NC (US); Bruce J. Lentner, Wilmington, NC (US); Philip O. Eisermann, Wilmington, NC (US)

(73) Assignee: GE-HITACHI NUCLEAR ENERGY AMERICAS LLC, Wilmington, NC (US)

( * ) Notice: Subject to any disclaimer, the term of this patent is extended or adjusted under 35 U.S.C. 154(b) by 101 days.

(21) Appl. No.: 13/709,955

(22) Filed: Dec. 10, 2012

(65) Prior Publication Data

US 2014/0159743 A1 Jun. 12, 2014

(51) Int. Cl.
*G01R 27/26* (2006.01)
*G01R 27/08* (2006.01)
*G01F 23/284* (2006.01)
*G01R 27/02* (2006.01)

(52) U.S. Cl.
CPC .............. *G01F 23/284* (2013.01); *G01R 27/02* (2013.01); *G01R 27/26* (2013.01); *G01R 27/2605* (2013.01)

(58) Field of Classification Search
CPC ...... G01F 23/284; G01R 27/02; G01R 27/26; G01R 27/2605

USPC ......... 324/600, 629, 635, 637, 642, 644, 649, 324/658, 661, 662, 691, 693, 699, 713, 715, 324/716
See application file for complete search history.

(56) References Cited

U.S. PATENT DOCUMENTS

| 3,474,337 | A |   | 10/1969 | Petrick |          |
|-----------|---|---|---------|---------|----------|
| 5,651,286 | A | * | 7/1997  | Champion et al. | .......... 73/290 V |
| 5,656,774 | A |   | 8/1997  | Nelson et al. |   |

(Continued)

FOREIGN PATENT DOCUMENTS

| JP | 2003-519376 A | 6/2003 |
| JP | 2003-519376 A | 6/2003 |
| JP | 4348292 B2    | 10/2009 |

OTHER PUBLICATIONS

Nemarich, Christopher P., "Time Domain Reflectomertry Liquid Level Sensors," IEEE Instrumentation and Measurement Magazine, IEEE Service Center, Dec. 1, 2001, pp. 40-44, vol. 4, No. 4, Piscataway, NJ.
EP Search Report and Written Opinion dated Mar. 19, 2014 issued in connection with corresponding EP Patent Application No. 13162152. 6.

(Continued)

*Primary Examiner* — Hoai-An D Nguyen
(74) *Attorney, Agent, or Firm* — Harness, Dickey & Pierce, P.L.C.

(57) ABSTRACT

A remote pulse TDR liquid level measurement system and method may include inserting a probe into a body of water. The probe has a probe/air interface, and the body of water includes an air/water interface. A narrow pulse is remotely transmitted to the probe via a coaxial cable. A first impedance mismatch is received from the probe/air interface in a form of a positive reflected pulse, and a second impedance mismatch is received from the air/water interface in a form of a negative reflected pulse. A time between the positive reflected pulse and the negative reflected pulse is calculated, and the time is converted to a distance, the distance being indicative of the water level.

24 Claims, 10 Drawing Sheets

(56) References Cited

U.S. PATENT DOCUMENTS

| | | | |
|---|---|---|---|
| 6,644,114 B1 | 11/2003 | McEwan | |
| 6,782,328 B2 * | 8/2004 | Lovegren et al. | 702/50 |
| 6,844,743 B2 * | 1/2005 | Lenormand et al. | 324/663 |
| 7,525,476 B1 * | 4/2009 | Delin et al. | 342/124 |
| 2004/0027137 A1 | 2/2004 | Sherrard | |
| 2008/0069266 A1 * | 3/2008 | Kuang | 375/295 |
| 2008/0078244 A1 | 4/2008 | Dietmeier | |
| 2010/0052658 A1 * | 3/2010 | Harres | 324/158.1 |

OTHER PUBLICATIONS

Office action issued in connection with JP Patent Application No. 2013-070798, Jun. 18, 2013.
Japanese Office Action issued in Japanese Patent Application No. 2013-070798, dated Jun. 10, 2013 and English translation thereof.
Japanese Notice of Allowance issued in Japanese Patent Application No. 2013-070798, dated Nov. 21, 2013 and English translation thereof.

* cited by examiner

100

200

FIG. 3A(1)
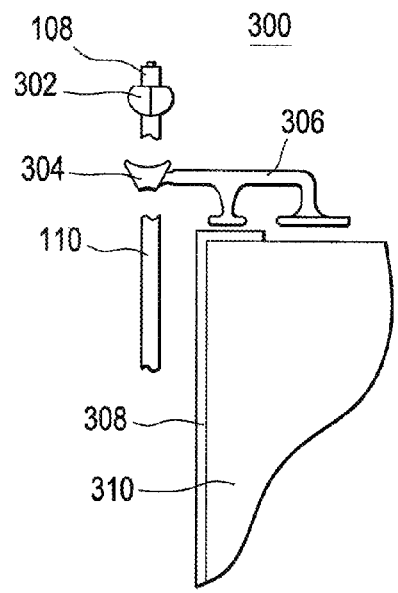
FIG. 3A(2)
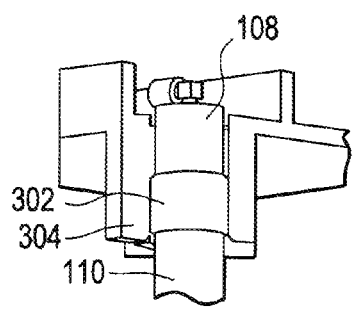
FIG. 3A(4)
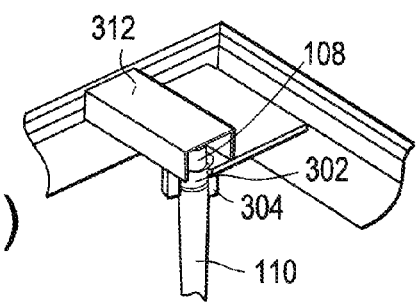
FIG. 3A(3)
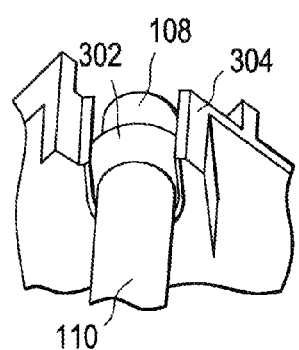

SYSTEMS AND METHODS FOR REMOTELY MEASURING A LIQUID LEVEL USING TIME-DOMAIN REFLECTOMETRY (TDR)

BACKGROUND

1. Field

The present disclosure relates to systems and methods for measuring a liquid level.

2. Description of Related Art

Conventionally, time-domain reflectometry (TDR) has been used to characterize and locate faults in metallic cables. Although there are time-domain reflectometry (TDR) based water level measurement systems, none are designed to remotely measure water levels (e.g., spent fuel pool (SFP) water levels) from relatively far distances by utilizing impulses and relatively highly specialized time-domain reflectometry (TDR) discrimination methods. For instance, one conventional time-domain reflectometry (TDR) system utilizes a step wave rather than impulse. Other conventional approaches include guided wave radar (GWR) techniques which use technology in this general category. However, all such conventional techniques require electronics in the vicinity (i.e., relatively close proximity) of the spent fuel pool (SFP) and, thus, are not suitable for water level measurement in a hostile post-accident environment which could include high radiation, high temperatures, high seismic activity, fire, explosions, and falling debris.

SUMMARY

Various embodiments herein relate to a remote pulse TDR system for measuring a water level (or any liquid level) in a tank (e.g., spent fuel pool) in a post-accident environment using electronics located remotely (up to 1000 ft or more) from the probe. No electric or electronic circuitry, which could be susceptible to the hostile post-accident environment conditions, is located at or near the probe.

The remotely located pulse TDR electronics chassis contains circuitry for generating an incident pulse and receiving reflected pulses. The pulse generating circuit is designed to produce a narrow incident pulse with a fast rise and fall time and sufficient amplitude for transmission over the long coaxial cable (up to 1000 ft or more) to the probe and producing reflected pulses from the probe with enough amplitude to travel back over the long coaxial cable transmission line and be measured by the receiving circuit. The pulse receiving circuit is designed to receive and identify/discriminate reflected pulses produced from two specific impedance mismatches in the probe, and to measure the time between them. The specific reflected pulses that are detected are from the following two major impedance mismatches.

The first reflected pulse (Pulse #1 ) is from the impedance mismatch between the low impedance coaxial transmission line cable and the high impedance probe top air interface. This results in a reflected pulse with positive polarity.

The second reflected pulse (Pulse #2 ) is from the impedance mismatch at the air/water interface in the probe. The dielectric constant of the air is lower than water, so this reflected pulse from a high to low impedance produces a reflected pulse with negative polarity.

The first reflected pulse provides a reference for the water level measurement since it occurs at a fixed location, whereas the second reflected pulse occurs at the water level interface and changes as the water level changes. Other impedance mismatches could also be deliberately added at specific locations to establish an alternate reference location for the water level measurement.

In the pulse TDR electronics, the reflected impedance mismatch Pulse #1 is automatically detected by noting when the amplitude of the leading edge of the positive pulse exceeds a fixed preset positive discriminator setting. Reflected impedance mismatch Pulse #2 is automatically detected by noting when the amplitude of the leading edge of the negative pulse drops below a fixed preset negative discriminator setting. A voltage ramp is started automatically when Pulse #1 is detected and stopped when Pulse #2 is detected, so that the ramp voltage is a measure of the time interval between the pulses. The time interval between reflected pulses is converted to distance based on initial system calibration. To minimize computation time and volume of data analyzed, the measurement system is initialized to only recognize the large impedance mismatch reflected Pulses #1 and #2 . The time it takes for the incident pulse to propagate down the long coaxial cable transmission line to the probe is blocked out in the electronics as 'dead time'. This 'dead time' depends on the length of the cable and is determined after the system is installed and the long coaxial cable transmission line lengths are established.

Basing the water level measurement on the time between the two reflected impedance mismatch Pulses #1 and #2 prevents inaccuracy due to changes in the pulse propagation speed in the 100-1000 ft or more of coaxial cable transmission line. Such changes can occur due to changes in dielectric material between the cable center conductor and shield due to crosslinking, oxidation, temperature changes etc. in a post-accident environment. Any small change in velocity could cause a significant error in water level because of the long length (e.g., 1000 ft.) of the cable. Use of the pulse TDR technology described in this disclosure is not subject to this cable degradation error.

Use of the narrow incident pulse with the pulse TDR system provides less distortion of the reflected pulse (compared to the incident) than a step wave TDR system. This is because the narrow pulse contains mostly high frequencies, and since these frequencies are attenuated uniformly as the pulse propagates down the long coaxial cable transmission line, the reflected impedance mismatch pulses have approximately the same shape (and specifically the same sharp distinct leading edge rise time) as the incident pulse. In contrast, the step wave contains a significant amount of low frequencies which are attenuated less than the high frequencies in the step wave. So for the same system gain needed to monitor the entire step wave, the low frequencies dominate, and the fast rise of the leading edge of the incident step wave is distorted to a slower rise for the reflected step wave. So the signal to noise ratio of a pulse TDR system described in this disclosure is higher than that of a step wave TDR system for measurement of water level.

The liquid level probe is designed so that the air interface at the top of the probe has a significantly higher characteristic impedance (~130 ohms) than the coaxial cable transmission line (e.g., 50 or 75 ohms) to create a positive amplitude reflected impedance mismatch pulse (Pulse #1 ) with sufficiently high amplitude. Since this reflected pulse occurs at a fixed location, its detection provides an exact reference point for the water level measurement.

The liquid level probe is designed so that the high probe impedance with air dielectric (130 ohms) is significantly higher than the low probe impedance with water dielectric (~15 ohms at room temperature), and this produces a significantly large amplitude negative pulse (Pulse #2 ) at the probe air/water interface. Since this reflected impedance mismatch pulse occurs at the water level, its detection relative to the positive pulse provides an exact measure of the liquid level from the reference point.

A relatively short length (e.g., 6 ft.) of coaxial calibration cable is used to connect the probe top and the coaxial cable transmission line (e.g., 1000 ft), to provide an alternate reference location for the water level measurement. The calibration cable is chosen to have the same impedance as the top of probe (~130 ohms). This arrangement with the calibration cable effectively lengthens the distance from the top of the probe to the water level from the pulse timing point of view, since it allows the first reflection impedance mismatch Pulse #1 to occur at the interface between the calibration cable and the 1000 ft. cable and does not provide an impedance mismatch pulse at the probe top. This arrangement provides more time between the positive and negative pulses for more accurate water level measurement. The use of a short calibration cable can also facilitate probe vertical movement and calibration, since the long coaxial cable transmission line may be fixed in a conduit and not able to move easily. Use of this configuration requires a calibration cable whose dielectric constant stays constant between calibrations and during accident conditions.

The calibration cable may be used to connect the probe top and the coaxial cable transmission line even for the case when the reference point for Pulse #1 is the top of the probe. For this case the calibration cable would have the same low characteristic impedance as the long coaxial cable transmission line (50 or 75 ohms) so there is no impedance mismatch at the point where the long coaxial cable meets the short calibration cable and the calibration cable would simply be an extension of the long coaxial cable. Such an arrangement would provide the capability to facilitate calibration but the reflected impedance mismatch Pulse #1 would still occur at the top of the probe.

The probe is designed in a coaxial transmission line configuration with an inner rod within an outer tube, and probe length equal to or more than the length of the water level that is to be measured (~35 ft. for the SFP application). To assure that the impedance characteristics are maintained throughout the length of the probe, the design provides thin insulating spacers located every 5 ft. between the inner and outer electrodes that assure that the geometry of the gap (or concentricity) between the probe inner and outer electrodes remains constant throughout the length of the probe. The probe top has a coaxial head connector which mates to the coaxial cable, and designed with a small axial length (e.g., few inches) so that it does not introduce an interfering reflected impedance mismatch pulse, and provides an effective seal between the inside and outside of the probe. The probe bottom has a plate that welds the center and outer electrodes which provides a solid probe design, and the impedance mismatch pulse from the bottom does not interfere with the water level measurement since it occurs later than the impedance mismatch Pulse #2 from the probe air/water interface.

The probe electrodes are fabricated with conducting metals (such as stainless steel) that propagate pulse TDR signals effectively and also make rugged probes capable of operating in hostile post-accident radiation, temperature, seismic and water quality environment. Conductive coatings using material such as gold can be put on the electrodes if necessary. The insulating spacers are made of materials that can be fabricated to meet the spacer design and to withstand high radiation, temperature and water quality environment (such as zirconium, ceramic, quartz) inside the probe. The insulator between the electrode connections in the probe top connector is made of a material that can be fabricated to meet the connecter design and to withstand high radiation and temperature environment in the probe above the SFP water.

The probe outer tube has holes in it throughout the length of the probe and in the bottom plate to allow water to move freely in the probe and to ensure that the water level inside the probe is the same as the water level outside the probe. The insulating spacers are also designed to allow water to move freely through and around them.

The probe may be installed in the SFP using a unique ball and socket design where the ball is welded to the probe and the socket is integral to a plate that is welded to SFP liner curb or anchored to the Refuel Floor. The probe hangs like a pendulum with the ball sitting in the socket. In a seismic event the probe would swing like a pendulum damped by the SFP water and restrained by the wall of the SFP. The low natural frequency reduces the seismic forces on the probe and simplifies its qualification to specified seismic spectra. The mounted probe assembly is fitted with a cover to protect it during normal and post-accident environment. The cover may also house the calibration cable and provide protection for the calibration cable and probe connector.

The probe and its mounting in the SFP are designed to allow for simple in-situ probe calibration. This in-situ calibration may be accomplished by simply raising and lowering the probe vertically in the SFP by means of a lifting ring (or hook) attached to the top of the probe, and measuring the corresponding change in water level relative to the top of the probe. The probe can be moved vertically by an amount equal to the length of the calibration cable (~6 ft.), and that may be all that is needed for the probe calibration. No removal of the probe from the SFP, or complicated means of raising and lowering the water in the probe, is required for probe calibration.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

FIG. 3A is a perspective view of a mounting arrangement for a system for measuring a liquid level according to a non-limiting embodiment.

DETAILED DESCRIPTION

Figure 1A:
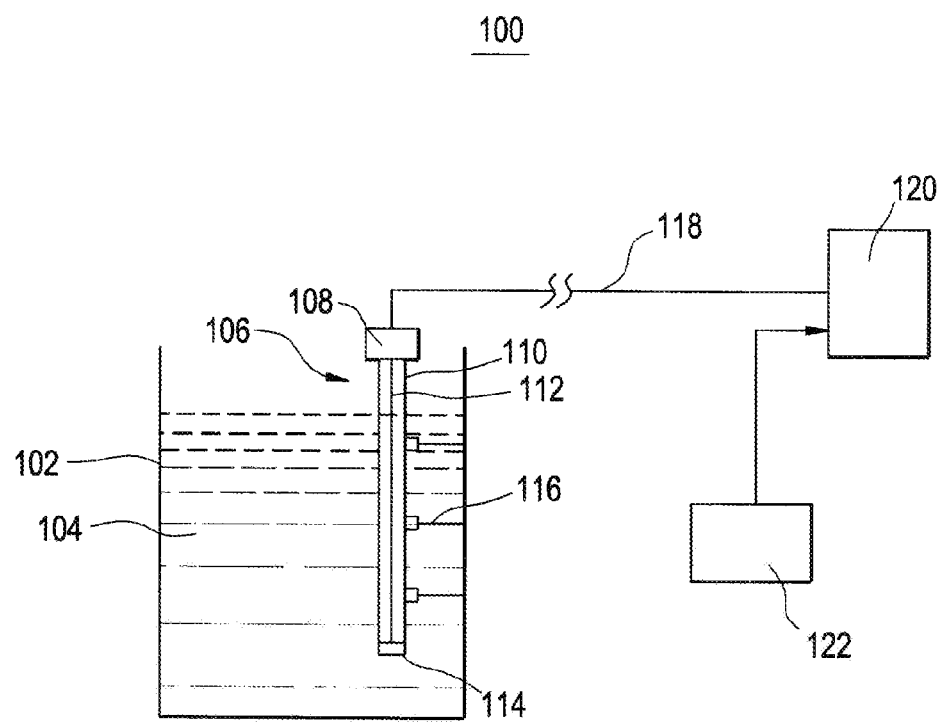
FIG. 1A is a schematic view of a system for measuring a liquid level according to a non-limiting embodiment.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

The present disclosure relates to unique instrument systems (probes and electronics) and methods for measuring a liquid level in a tank, for instance, a water level in a spent fuel pool (SFP) of a nuclear reactor, although example embodiments are not limited thereto. Rather, it should be understood that the reference to the measurement of water level in this disclosure may be generalized to the measurement of any liquid level, since the instrument systems and methods herein may be used to measure any liquid level in a variety of containers.

The instrumentation system herein is unique in that it sends a narrow width (nanosecond) pulse (referred to as an "impulse") down a relatively long cable transmission line to a probe and measures the time between reflected impulses created by specially designed impedance mismatch conditions using a special discriminator technique. In this system, the time-domain reflectometry (TDR) pulse generation and measurement electronics can be located remotely at a relatively far distance (e.g., a thousand feet) from the spent fuel pool (SFP).

The disclosure herein may be utilized to monitor the water level in a nuclear reactor spent fuel pool (SFP) in a post-accident environment. However, it should be understood that the technology may also be readily adapted for water level measurement inside the nuclear reactor pressure vessel (RPV) or other water level measurement applications requiring remote electronics and a rugged probe.

Figure 1B:
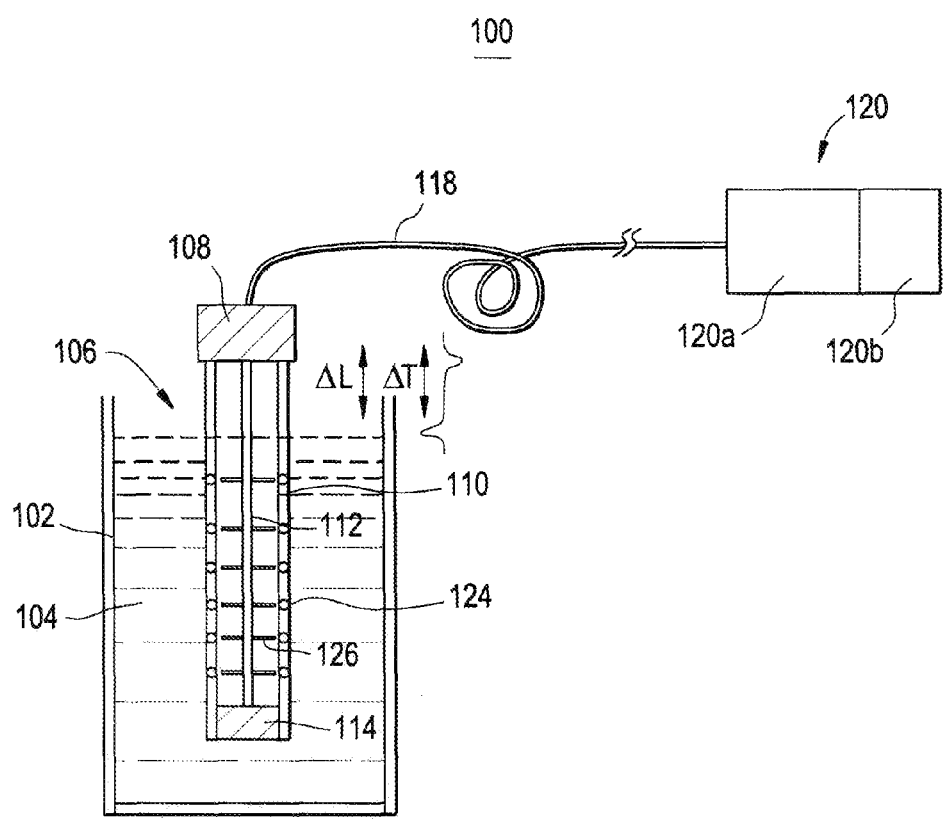
FIG. 1B is a schematic view of another system for measuring a liquid level according to a non-limiting embodiment.
Figure 1C:
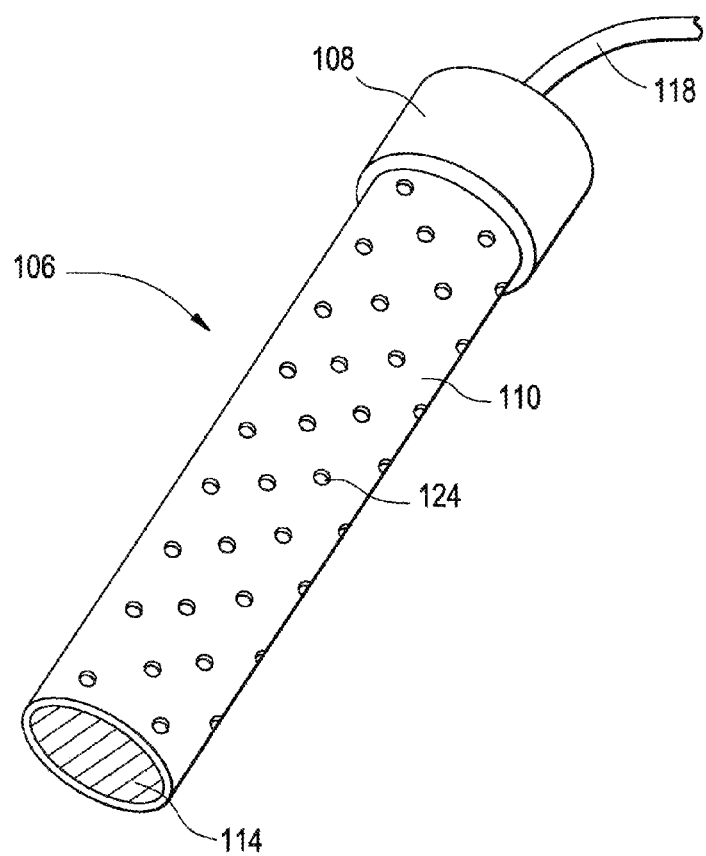
FIG. 1C is a perspective view of a probe that may be used in the system of FIG. 1A or the system of FIG. 1B.

FIG. 1A is a schematic view of a system for measuring a liquid level according to a non-limiting embodiment. FIG. 1B is a schematic view of another system for measuring a liquid level according to a non-limiting embodiment. It should be understood that any of the features, arrangements, and/or configurations shown in FIG. 1A but not explicitly shown in FIG. 1B may also be applied to FIG. 1B and vice versa. FIG. 1C is a perspective view of a probe that may be used in the system of FIG. 1A or the system of FIG. 1B.

Referring to FIGS. 1A-1C, a system 100 includes a probe 106 that is mounted inside a tank 102 containing a body of water 104 (e.g., spent fuel pool of nuclear reactor), although it should be understood that the teachings herein may be applied to liquids in general. The probe 106 includes a conductive rod 112 arranged within a conductive tube 110. The conductive tube 110 may include a plurality of perforations 124 along its entire length. A plurality of insulating spacers 126 may be used to maintain a coaxial arrangement between the conductive rod 112 and the conductive tube 110. A tensioning device 114 may be provided at a lower end of the conductive tube 110. The probe 106 may be secured to the inner sidewalls of the tank 102 with lateral supports 116. A coaxial cable 118 connects a pulsing unit 120 to the probe 106 via a head connector 108. The pulsing unit 120 may include a discriminator 120a and a level display 120b. A calibrator 122 may be utilized in connection with the pulsing unit 120.

In further detail, the system 100 includes a specially designed probe 106 (or sensor) which is placed inside the tank 102 whose water level is to be measured. The probe 106 is connected through a specially designed head connecter 108 to a low leakage but long coaxial cable 118 (transmission line) to a uniquely designed pulsing unit 120 (TDR pulse sending and receiving unit). The coaxial cable 118 may range from 100 to 1000 feet long. For instance, the coaxial cable may be 250 feet, 500 feet, or 750 feet long, although the present disclosure is not limited thereto.

The probe 106 has a length slightly longer than the water level to be measured (approximately 35 feet for a spent fuel pool monitoring application) and has a coaxial configuration consisting of a conductive rod 112 (an electrically conducting center rod or tube) which forms one electrode, and a conductive tube 110 (an outer electrically conducting tube) which forms the other electrode. The probe 106 is passive and has no moving parts or active components. The outer diameter of the conductive rod 112 (inner electrode) and the inner diameter of the conductive tube 110 (outer electrode) are specially selected to assure that there is a significant increase of impedance between the cable transmission line and the probe air interface and a significant decrease in impedance between the probe air and water interface.

Another factor in selecting the diameters of the two electrodes is to assure mechanically that the gap or spacing between the electrodes remains constant throughout the entire length of the probe 106. Various probe development models have been constructed for test purposes, and tests have been performed with probes where the inner electrode is a wire with OD~0.064 inches and the outer electrode is a tube with ID~0.822 inches, and probes where the inner electrode is a rod with OD~0.125 inches and the outer electrode is a tube with ID~2.37 inches. Other coaxial probe designs which maintain an adequately high ratio between the outer electrode ID and the inner electrode OD can also be used, as long as the probe mechanical requirements are satisfied. An important mechanical requirement is that the conductive rod 112 (center conductor) maintains a constant spacing to the walls of the conductive tube 110 so that the gap geometry (or concentricity) is maintained throughout the entire length of the probe 106 even under a seismic load. Maintaining concentricity assures that the reflected pulses will depend only on the level of the water in the probe 106 for accurate water level detection.

One potential design to assure concentricity is to mount a sufficient number of thin insulating spacers 126 (referred to as separation discs or spacers) on to the conductive rod 112 (center electrode or conductor). The distance between the insulating spacers 126 mounted on the center electrode depends upon the probe design and how rigid the center electrode is. For the less rigid 0.064 inch diameter center electrode the insulating spacers 126 may need to be placed every 1 ft along the probe length, but for the rigid ¼ inch diameter center rod design, the insulating spacers 126 can be spaced 5 to 10 ft apart. The insulating spacers 126 are designed to allow water to pass freely through and/or around them while maintaining a coaxial configuration and electrical separation between the center and outer conductor.

The insulating spacers 126 are made from materials such as ceramic, glass, quartz, etc. to withstand the post-accident temperature and radiation conditions and chemical properties of the water inside the spent fuel pool (SFP). The introduction of insulating spacers 126 can complicate the probe design and potentially affect the impedance and water level measurements at their locations, so it is desirable to limit the number of insulating spacers 126 in the probe 106. One way to reduce the number of insulating spacers 126 is to stiffen the center electrode by applying tension to it at both ends via a tensioning device 114, but care must be taken to assure that the strength of the center electrode is maintained and there is no undue stress on the cable wires soldered to the head connector 108 at the top of the probe 106. The insulating spacers 126 are designed to allow the water to move freely past them as the water level changes. The outer conductive tube 110 has perforations 124 (holes) throughout its entire length to allow water to move freely in and out of the probe 106 so that the level of water inside the probe 106 is the same as that of the pool in which the probe 106 is located.

The center conductor and tubular outer conductor materials are specially designed for efficient TDR pulse propagation and also to withstand corrosion effects of the water in the SFP, and the effects of gamma radiation and elevated temperature from the spent fuel. The probe top has a coaxial connector with a ceramic insulator capable of operating in the post-accident environmental and radiation conditions, which connects the center and outer probe electrodes to the coaxial cable for transmission to the remotely located TDR electronics. The center and outer conductor electrode connections to the coaxial connector at the top of the probe 106 are specially designed for efficient TDR pulse propagation. The probe 106 is inserted vertically in the SFP and the mounting is designed to meet seismic qualification requirements.

The remotely located TDR electronics chassis contains circuitry for generating pulse and receiving reflected pulses. The pulse generating circuit is designed to produce a narrow pulse with a fast rise and fall time (e.g., 1 to 10 ns) and sufficient amplitude for transmission over the long (up to 1000 ft) coaxial cable 118 to the probe 106 and producing reflected pulses from the probe 106 with enough amplitude to travel back over the long coaxial cable 118 and be measured by the receiving circuit. The pulse receiving circuit is designed to receive and identify/discriminate reflected pulses produced from two specific impedance mismatches in the probe, and to measure the time between them. The specific reflected pulses that are detected are from the following two major impedance mismatches. The first reflected pulse (Pulse #1) is from the impedance mismatch between the low impedance coaxial transmission line cable and the high impedance probe top air interface. This results in a reflected pulse with positive polarity. The second reflected pulse (Pulse #2 ) is from the impedance mismatch at the air/water interface in the probe. The dielectric constant of the air is lower than water, so this reflected pulse from a high to low impedance produces a reflected pulse with negative polarity.

The first reflected pulse provides a reference for the water level measurement since it occurs at a fixed location, whereas the second reflected pulse occurs at the water level interface and changes as the water level changes. Other impedance mismatches could also be deliberately at specific location to establish an alternate reference location for the water level measurement. For example a short fixed length of calibration cable with the same characteristic impedance as that of the probe 106 with air dielectric, can be used to generate the positive TDR reflected impedance mismatch pulse (Pulse #1), while the air/water level interface would continue to generate the negative TDR reflected impedance mismatch pulse (Pulse #2).

To obtain good resolution and good signal to noise ratio for the reflected TDR pulses, special electronics are needed to generate high amplitude narrow width voltage incident pulses with fast rise and fall times (e.g., ~1 nano second), that have sufficient energy to propagate to the end of a long (up to 1000 ft) coaxial cable 118 (transmission line) to the probe 106. The coaxial cable 118 from the remotely located electronics to the probe 106 is designed with low loss characteristics at the frequencies of interest such that after the incident pulse propagates to the end of the long coaxial cable 118, the reflected impedance mismatch pulses (Pulses #1 and Pulse #2) have sufficient amplitude and are narrow enough with fast rise times to be resolved by the pulse receiving circuitry. The larger the pulse amplitude at the pulse generator, the greater the reflected impedance mismatch pulse amplitude received from the long (e.g., 500 to 1000 ft) coaxial cable 118 (transmission line), and the greater the signal to noise ratio for improved measurement accuracy.

Tests were conducted to prove the viability of the TDR pulse measurement concept described in this disclosure, and the results of these tests are described in a later section. An incident pulse amplitude at the generator of 250 mv was adequate for 450 feet of 75 ohm coaxial cable that was readily available from the vendor Rockbestos. Other development tests with improved incident pulse generation electronics which produced higher amplitude (~5 volts) pulses, and use of 1000 ft of special low loss 50 ohm cable from the vendor Times Microwave, have yielded reflected TDR impedance mismatch pulses with an improved higher amplitude (~450 mV). Further optimization of the pulser circuit can generate even higher incident pulse amplitudes which can further increase the amplitude of the reflected TDR impedance mismatch pulses to further improve the resolution and signal to noise ratio for accurate TDR based water level measurements with coaxial cable transmission lines greater than 1000 feet, if required.

The electronic system is designed to have the capability of automatically detecting the following two reflected impedance mismatch pulses. Pulse #1 is reflected from either of the following two impedance mismatch configurations. First, there is an impedance mismatch between the coaxial cable transmission line (characteristic impedance~50 or 75 ohms) and the coaxial connector at the top of the probe (characteristic impedance~130 ohms). Second, there can also be an impedance mismatch between the coaxial cable transmission line (characteristic impedance~50 or 75 ohms) and a fixed short length of cable (called probe calibration cable) with the same characteristic impedance as the probe top (characteristic impedance~130 ohms).

Both these configurations produce a adequately large amplitude positive pulse because of the large 80 or 55 ohm impedance mismatch. The first configuration without the high impedance calibration cable provides a water level measurement that is independent of the calibration cable. However this configuration is suitable when the pulses are very narrow and the electronics are fast enough to discriminate and measure the time between Pulse #1 and Pulse #2. For this configuration the probe 106 is positioned vertically in the tank 102 such that there is minimum distance between the probe head connector 108 and the highest anticipated water level in the SFP to enable sufficient time interval between pulses for accurate measurements. Use of the high impedance calibration cable in the second configuration provides greater time between Pulses #1 and #2, and from the timing point of view effectively raises the probe head connection. The extra time is equal to the length of the cable divided by the speed of the pulse in cable.

Use of a calibration cable also allows the probe to be moved up and down easily for calibration without moving the 1000 ft cable which may be rigidly mounted in the SFP. Since the calibration cable is short (~6 ft) it does not need to have the same loss characteristics as the long coaxial cable transmission line and is designed to be flexible to facilitate calibration and to have the required characteristic impedance and the required ruggedness for the post-accident environment. A similar small length of calibration cable could also be included in the first configuration to facilitate calibration, but the characteristic impedance of this calibration cable would need to be the same as the long coaxial cable transmission line (50 or 75 ohms) so that there is no impedance mismatch at that junction and the impedance mismatch for Pulse #1 occurs at the top of the probe. For both configurations, the positive pulse (Pulse #1) is fixed in time and does not vary with water level, and so provides a constant reference to measure the water level from.

Pulse #2 reflected from the impedance mismatch at the air/water interface in the probe 106. The large impedance mismatch (130 ohms in the probe air column above the water level to ~15 ohms in the probe water column at and below the water level) produces a large negative pulse. The timing of the negative pulse varies with water level, and specifically the timing of the leading edge of the negative pulse is an accurate measure of water level.

The system receiving electronic circuitry determines water level as follows, particularly measuring the time interval between the positive (Pulse #1) and negative (Pulse #2) impedance mismatch reflected pulses described above. The start time of the interval measurement is detected by noting the time when the amplitude of the leading edge of the positive pulse exceeds a fixed preset positive discriminator setting. The stop time of the interval measurement is detected by noting the time when the amplitude of the leading edge of the negative pulse drops below a fixed preset negative discriminator setting. The TDR measurement system uses fast discriminators to detect and establish the time interval between Pulse #1 and Pulse #2, and the discriminators are set above the noise level in the signal. To minimize computation time and volume of data analyzed, the measurement system is initialized to only recognize the large reflected pulses (Pulse #1 and Pulse #2) originating from the impedance mismatches discussed above occurring beyond the long coaxial cable transmission line. The time it takes for the incident pulse to propagate down the long coaxial cable 118 (transmission line) to the probe is blocked out in the electronics as 'dead time'. This 'dead time' depends on the length of the coaxial cable 118 and is determined after the system is installed and the coaxial cable lengths are established.

The measured time interval between the reflected pulses is converted to distance based on an initial system calibration. In this initial calibration the water level inside the probe 106 is measured separately and correlated to the measured time interval between the reflected impedance mismatch Pulses #1 and #2. Note that this water level measurement is based only on when the dielectric changes from air to water, and therefore is insensitive to water temperature or purity of the water. Also, since the measurement relies on time interval between reflected pulses from the impedance changes near (or at) the probe head connector 108 and the water level, it is insensitive to changes in pulse propagation velocity due to potential changes of the dielectric material in the long (up to 1000 ft) coaxial cable 118 (transmission line) connecting the electronics to the probe 106 which may occur due to post accident environmental conditions and due to the long (~40 year) system design life. The propagation velocity of a pulse in the region between the probe head connector 108 and water level is relatively constant because the dielectric constant of the air does not change significantly with temperature (~5 ppm per degrees C.) or humidity (~1.4 ppm per % RH), so the calibration is sufficiently accurate over the full operating range.

System calibration depends on the vertical positioning of the probe 106 at installation. Once installed the probe calibration does not change since the time interval between reflected Pulses #1 and #2 depends only on the distance between the probe head connector 108 and water level. Note that the amplitude of the reflected pulse from the air/water interface (Pulse #2) could change slightly (~15%) because of temperature related changes to the dielectric constant of the water, but the time at which this impedance mismatch pulse occurred would not change. Thus although the amplitude of the reflected impedance mismatch pulse could change, the time of the reflected pulse depends only on the SFP water level and would not change if the level did not change, regardless of the water temperature. The remote electronics and discriminator circuits can be calibrated periodically for drift by using a calibrator 122 (e.g., an external calibration source).

Figure 2:
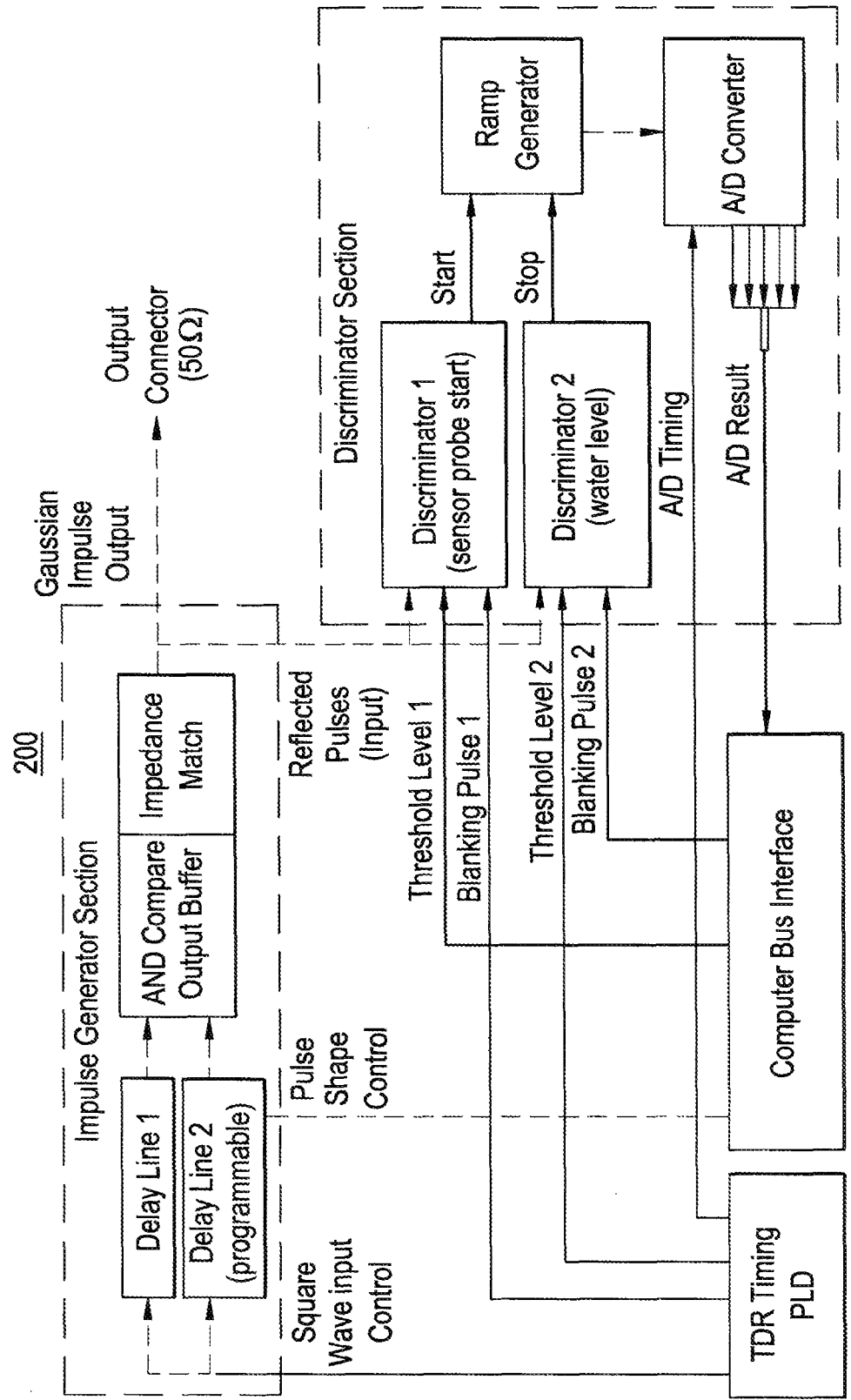
FIG. 2 is a block diagram of the electronics that may be used in a system for measuring a liquid level according to a non-limiting embodiment.

FIG. 2 is a block diagram of the electronics that may be used in a system for measuring a liquid level according to a non-limiting embodiment. Referring to FIG. 2, the block diagram 200 is one possible configuration for the electronics in the pulsing unit 120. The remote system electronics basically consists of an incident pulse generating circuit (Impulse Generator Section) which generates and transmits pulses to the probe 106 via a long (up to 1000 ft) coaxial cable 118 (transmission line), and a reflected impedance mismatch pulse receiving circuit (Discriminator Section) which receives and detects reflected impedance mismatch Pulses #1 and #2 and measures the time between them. The incident pulse generation rate is adjusted so that the reflected Pulses #1 and #2 from one generated incident pulse can be measured before the next incident pulse is generated for transmission down the long coaxial cable 118 (transmission line) to the probe 106.

Since the incident pulse transmission velocity is very fast (approximately 0.7 times to 1.0 times the speed of light depending on the dielectric material of the coaxial cable 118 and the air in the probe 106), the incident pulse repetition rate (PRR) is selected to provide a virtually continuous water level measurement (approximately 10-100 microseconds) without interfering with the time it takes for each incident pulse generated in the electronics to propagate down the coaxial cable 118 to the probe 106 and the reflected impedance mismatch pulses from the probe 106 to propagate back up the coaxial cable 118 from the probe 106 to the electronics. There are several kinds of incident pulses that can be used for the TDR measurement, including a step waveform which is commonly available in most commercial TDR equipment, and an impulse waveform described herein which requires special pulse generation circuitry but provides improved resolution and signal to noise ratio for water level measurements over long distances (e.g., over 1000 feet) and simplifies the discrimination of the positive and negative amplitude reflected impedance mismatch Pulses #1 and #2 for more accurate time interval and water level measurements.

This disclosure describes a unique design utilizing a programmable impulse function generator for generating the incident pulse. The Impulse function generator provides relatively high amplitude incident pulses (~5 volts) with fast rise and fall times (~1 nanosecond). The concept is to generate a single incident pulse by logically combining two step waveforms that differ in propagation delay by approximately 1 to 10 nanoseconds. The incident pulse width can be adjusted using programmable logic but is kept sufficiently narrow to provide reflected impedance mismatch Pulses #1 and #2 which can be resolved to accurately measure the time interval between them over the entire water level measurement range. This incident pulse is buffered and coupled to the long coaxial cable 118 with an impedance matching circuit. The coaxial cable 118, which acts as a transmission line, has a relatively low characteristic impedance (50 to 75 Ohms) and is specially designed to have low loss characteristics in order to minimize the incident pulse attenuation for pulse propagation over 1000 ft length of the coaxial cable 118.

This disclosure describes a unique design utilizing several programmable discriminators for detecting reflected impedance mismatch Pulses #1 and #2. The reflected pulses are input to several programmable discriminators that start and stop ramp generators based on reflected pulse polarity and amplitude to measure the time difference between reflected impedance mismatch Pulses #1 and #2. A circuit called the blanking pulse circuit, is used to blank out the generated incident pulse and any small amplitude reflected noise pulses in the long coaxial cable 118 (transmission line) to the probe 106, so that only the large reflected positive and negative Pulses #1 and #2 are recognized by the discriminator circuit. The width of the blanking pulse is adjustable so that it properly accounts for incident pulse transmission in various coaxial cable transmission line lengths used for any specific plant application.

The instrument is calibrated initially using known water levels and correlating that to measuring the time between reflected impedance mismatch pulses. For a fixed probe geometry, the time between the reflected impedance mismatch Pulses #1 and #2 is only a function of the water level and does not depend on the temperature or impurity of the water. Changes in temperature or impurity of the water could affect the magnitude of the reflected negative pulse but would not affect the water level measurement since for a given water level the reflected impedance mismatch pulse occurs at the same time. The measured water level is displayed and can be digitized and time stamped and sent via fiber-optic cable (or other digital communication cable) to other SFP monitoring stations in the plant. The measurement electronics takes very little power and can be battery operated during station blackout (SBO) conditions. Several means of conserving power during SBO are provided, including screen saver and on-demand measurement and display, for the purpose of prolonging battery life.

The system can also measure SFP temperature using a standard thermocouple (or RTD) mounted in a tube affixed on the outside of the water level probe. The system can also measure and display trend and rate of change of SFP water level and SFP temperature, and can provide alarms on either level or rate of change when the level decreases below or rate of change increases above predetermined values. All measured and calculated SFP data can also be transmitted digitally over cable (or wirelessly) to remote SFP monitoring stations.

The passive probe 106 (or sensor) consists basically of a conductive rod 112 (center electrical conductor) inside a conductive tube 110 (hollow outer tube), approximately 35 feet long. The center conductor has an inner core made from strong material (stainless steel) which has enough conductivity for efficient pulse transmission. The stainless steel provides the required strength and is chemically non-reactive so is well suited for long term residence in the SFP, though other material could also be used as long as it does not degrade propagation of the narrow electro-magnetic pulses. If for some applications greater inertness and greater resistance to corrosion is required, the probe material can be coated with a thin layer of gold, which also has excellent electrical conduction properties. Use of gold is expensive but a gold layer that is only 200 microns thick is all that is needed since the TDR pulse propagates primarily on the outer surface of the center conductor. The probe design also needs to be strong and rugged and capable of residing in the SFP for 40 years without significant degradation, and capable of withstanding the corrosive effects of the SFP water under normal and post-accident operating conditions.

The design of the conductive tube 110 (tubular outer conductor) includes perforations 124 (e.g., holes (~¼ inch diameter)) throughout its length and at the bottom to allow SFP water to enter and move about freely in the probe 106 so that the water level in the probe 106 is the same as the water level in the SFP. A key element of the probe design is the use of insulating spacers 126 to assure that the conductive rod 112 (center conductor) maintains a precise spacing to the conductive tube 110 (outer conductor) so that the probe characteristic impedance maintains the design value throughout the length of the probe 106, and also allows water to flow freely inside the probe 106 to assure that the water level inside the probe 106 is the same as that in the SFP. One design concept for the insulating spacers 126 is a thin wafer (made of ceramic, quartz, etc.) that is anchored to the conductive rod 112 (center conductor) and has a diameter slightly less than the ID of the conductive tube 110 (outer tube).

The probe 106 has a coaxial probe head connector 108 with a ceramic insulator which connects the probe center conductor and outer conductor to the calibration cable and then to the long coaxial cable 118 (transmission line) to the remotely located TDR electronics. The center and outer conductor electrode connections to the coaxial connector at the top of the probe 106 (referred to as the probe head connector 108) are specially designed for efficient TDR pulse propagation and to not degrade the reflected impedance mismatch Pulse #1 at the probe head connector/air interface. Since the head connector 108 is fixed, the reflected impedance mismatch Pulse #1 at the top of the probe 106 provides a constant reference point for the water level measurement. The reflected impedance mismatch Pulse #2 from the air/water level interface in the probe 106 locates the variable water level to be measured. The probe 106 can be mechanically closed at the bottom by welding a metal plate to the bottom of the outer tube and center rod, because although this would electrically short the outer and inner conductors, it does not affect the reflected impedance mismatch Pulses #1 and #2 that are used for water level measurement since these pulses are reflected above the bottom of the probe 106 and occur later in time. The bottom plate would need to have holes in order to not trap water in the probe but to allow the water to leave the probe and communicate freely with the SFP water.

The probe 106 is positioned vertically in the spent fuel pool (SFP) and conceptually could be anchored to the wall of the tank 102 to meet seismic requirements. However such an installation in the SFP is complicated for SFPs that contain spent fuel because of radiation from the spent fuel.

Figure 3B:
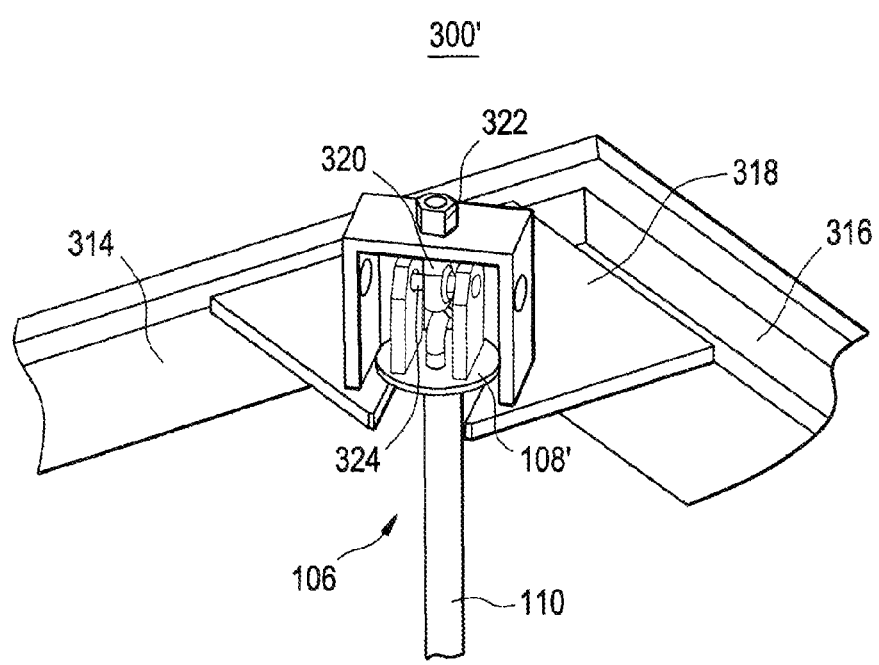
FIG. 3B is a perspective view of another mounting arrangement for a system for measuring a liquid level according to a non-limiting embodiment.

FIG. 3A is a perspective view of a mounting arrangement for a system for measuring a liquid level according to a non-limiting embodiment. FIG. 3B is a perspective view of another mounting arrangement for a system for measuring a liquid level according to a non-limiting embodiment. Referring to FIG. 3A, a unique method of installing this probe 106 is to use a swivel type of connection such as a ball-socket mounting arrangement 300 where the ball 302 is welded to the probe 106 and the socket 304 is anchored to the side or floor 310 of the SFP via a support arm 306. The side or floor 310 may be covered with a liner 308. Anchoring can be made by the use of anchor bolts in the SFP floor 310, or by welding a mounting plate directly to the top of the curb. A cover 312 may also be provided. The probe 106 would hang as a pendulum with the ball 302 sitting in the socket 304. In a seismic event the probe 106 would swing as a pendulum damped by the SFP water and its motion would be restrained by the SFP wall next to which the probe 106 is mounted, and would not impact or damage the spent fuel. This arrangement reduces the seismic forces in the probe 106 and simplifies its qualification to specified seismic loads.

Referring to FIG. 3B, another method of installing the probe 106 is using a rod-end mounting arrangement 300'. Both mounting configurations allow the probe 106 to be located as close as possible to the SFP corner. A mounting plate 318 may be secured to the curb 314 while being adjacent to a trough 316. The head connector 108' is connected to the rod end 320 with a pin 324 and nut 322. The mounted probe assembly may be fitted with a protective cover after installation.

Figure 4A:
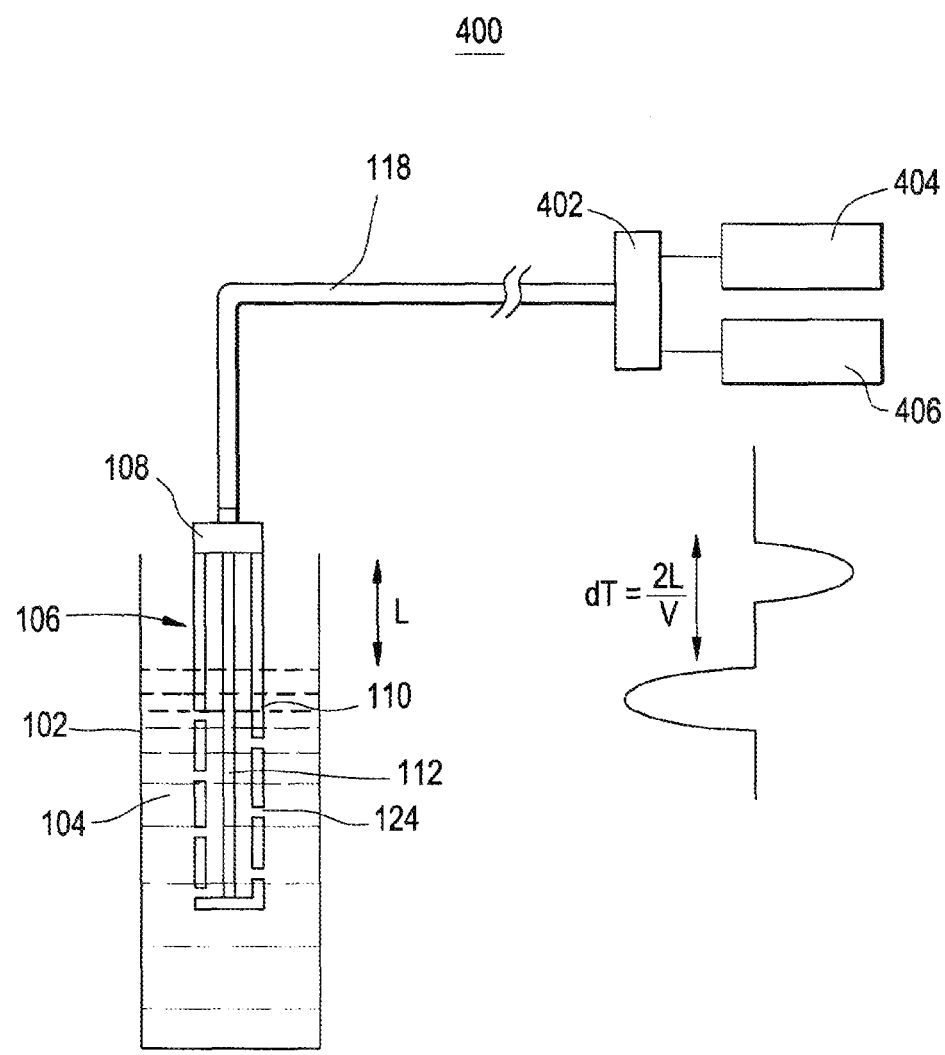
FIG. 4A is a schematic view of a system for measuring a liquid level in a proof-of-concept test according to a non-limiting embodiment.
Figure 4B:
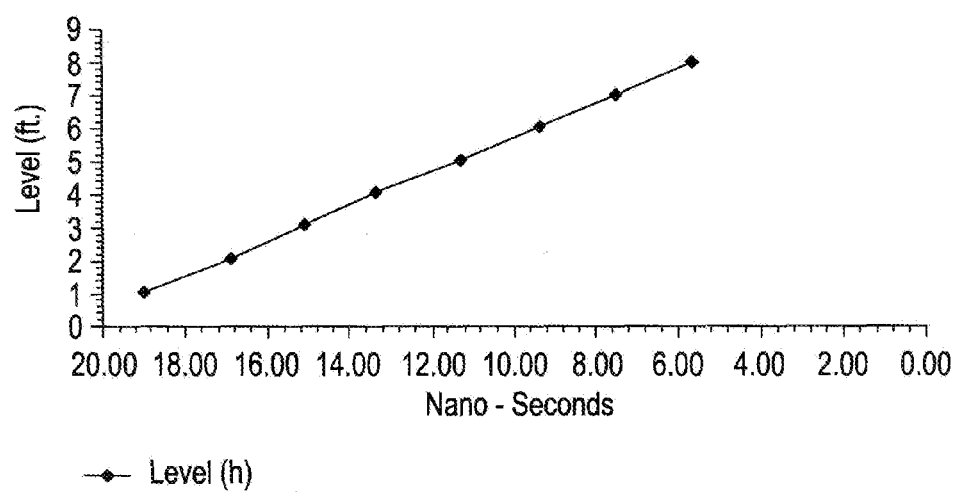
FIG. 4B is a graph of the results of the proof-of-concept test conducted with the system of FIG. 4A.

Two tests, first an initial proof-of-concept test and then a conceptual development prototype test, were performed to verify the conceptual design of the GEH SFPLMS. FIG. 4A is a schematic view of a system for measuring a liquid level in a proof-of-concept test according to a non-limiting embodiment. FIG. 4B is a graph of the results of the proof-of-concept test conducted with the system of FIG. 4A.

An initial proof-of-concept test was performed to demonstrate the feasibility of this method for monitoring water level in the spent fuel pool. This was a test done with an oscilloscope 406 and was based on visual measurement of time interval between reflected impedance mismatch Pulses #1 and #2 on the oscilloscope 406, and did not include automatic detection of the pulses and automatic measurement of time between these reflected impedance mismatch pulses.

For the test the following test articles were fabricated. The coaxially configured probe 106 was 10 feet long. The conductive tube 110 (outer electrode) was copper tube (0.822 inch diameter ID) with many perforations 124 (¼ inch holes) drilled in it over the entire length. The conductive rod 112 (center electrode) was a copper wire (OD 0.064 inches). This created a probe 106 in which the impedance with the air dielectric of ~150 ohms and with water dielectric of ~17 ohms. The coaxial head connector 108 at the top of the probe 106 was designed specially to have no electrical discontinuities, and had a polyethylene insulator between the electrode connections. The connector outer electrode was soldered to the tube so that the inner wall of the tube was electrically connected to the bottom flange of the connector, and the center pin of the coaxial connector was soldered to the probe copper center conductor. Insulating separator discs (~125 mils thick polyethylene with diameter 30 mils smaller than the ID of the tube) were mounted on the conductive rod 112 (center conductor) approximately every 6 inches to maintain a constant spacing between the probe electrodes and to keep assure that the center conductor did not touch the sides of the tube and short out the probe 106. A tensioning device 114 was mounted at the bottom off the probe 106 to keep the center conductor straight. A 450 feet coaxial cable 118 with a 75 ohm impedance (made by Rockbestos) was used to connect the probe 106 to the electronics via a tee 402. A 50 Ohm coaxial cable 118 can also be used in the final design. The incident pulse generator 404 in a TDR electronic box made in the laboratory was used to make a fast rise time incident pulse, and the reflected impedance mismatch Pulses #1 and 2 were monitored by a Tektronix scope (1.25 GHz sampling speed) connected to the receiving circuitry of the TDR electronic box.

Initial tests were conducted by inserting the probe 106 in the GEH San Jose training facility pool. Data was taken for various water levels by raising and lowering the probe 106 in the pool. Data consisted of measuring the time between the reflected pulses from impedance mismatch (75 to 150 ohms) at the probe head connector/air interface and impedance mismatch (150 to 17 ohms) at the air/water level interface. The pulse timing was determined by visually observing the time corresponding to when the positive pulse (Pulse #1) rises above the base-line axis and the negative pulse (Pulse #2) falls below the base-line axis of the TDR trace signature. Results of this initial test are shown in Table 1 and graphed in FIG. 4B.

TABLE 1

| Nano-seconds | Level (ft) |
|---|---|
| 5.68 | 8 |
| 7.52 | 7 |
| 9.36 | 6 |
| 11.3 | 5 |
| 13.3 | 4 |
| 15.1 | 3 |
| 16.9 | 2 |
| 19.0 | 1 |

These results demonstrate that reflected impedance mismatch Pulses #1 and #2 can be used with remotely located impulse TDR instrumentation for accurate water level measurement. As expected, the time interval between the start of the reflected impedance mismatch Pulses #1 and #2 is linearly proportional to the water level. The accuracy of the water level measurement was better than 0.5 feet, and this accuracy can be improved to 1 to 2 inches by fine tuning the TDR instrument electronics and incorporating a narrower incident pulse width and a lower loss coaxial cable 118.

A test was also conducted to determine the effect of boiling water on the water level measurement. For this test the 10 ft probe was put in a ~3 ft high vat with a heater that brought the water to a boil. The presence of steam in the probe was assured by observing steam pouring out of the holes in the probe 106. Water level was visually measured with an oscilloscope 406 as before with and without steam. Results of the test demonstrated that the steam environment due to boiling water did not affect the accuracy of the water level measurement. This test result was as expected because the presence of steam in the air space above the water at atmospheric pressure has an insignificant effect on the dielectric constant and pulse propagation velocity.

Figure 5A:
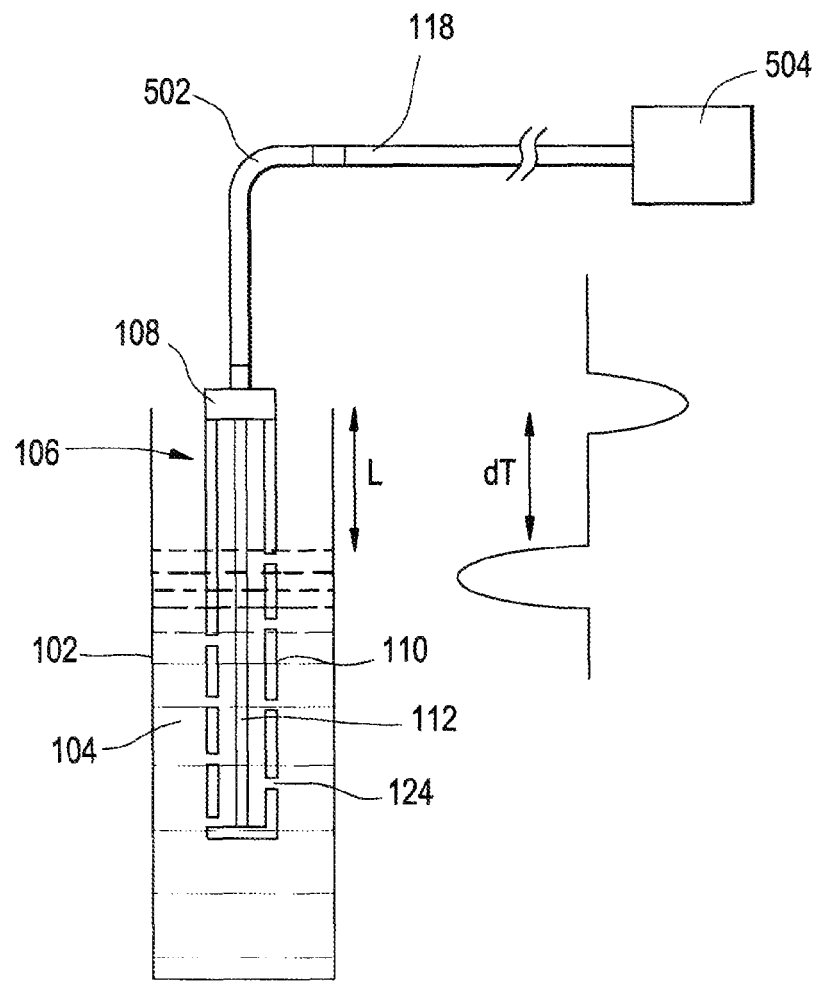
FIG. 5A is a schematic view of a system for measuring a liquid level in a conceptual development prototype test according to a non-limiting embodiment.
Figure 5B:
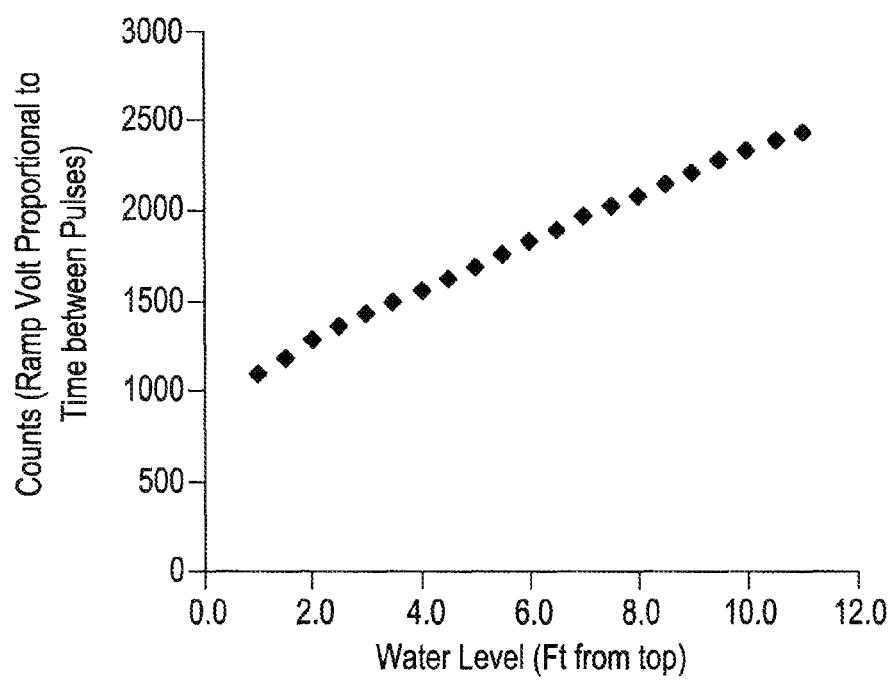
FIG. 5B is a graph of the results of the conceptual development prototype test conducted with the system of FIG. 5A.

FIG. 5A is a schematic view of a system for measuring a liquid level in a conceptual development prototype test according to a non-limiting embodiment. FIG. 5B is a graph of the results of the conceptual development prototype test conducted with the system of FIG. 5A. A conceptual development prototype test was performed to demonstrate the feasibility of this pulse TDR instrumentation method for automatic monitoring of water level in the spent fuel pool remotely from 1000 ft. This test also included automatic detection of reflected impedance mismatch Pulses #1 and #2, and automatic measurement of time between these reflected pulses.

For the test the following test articles were fabricated. Two identically designed probes, except the outer tube and inner rod was made from Stainless Steel for the first probe and from Aluminum for the second probe. The probes 106 were 12 feet long and the outer electrode was a conductive tube 110 (OD 2.37 inches, ID 2.24 inches) with many perforations 124 (¼ inch holes) drilled in it over the entire length of the probe 106. The inner electrode was a conductive rod 112 (¼ inch in diameter) which established the probe characteristic impedance with air dielectric at ~137 ohms and with water dielectric at ~15 ohms. The probe coaxial head connector 108 was designed to fit this geometry and had a special insulating material (PEAK) between the electrodes. Since the center rod was stiff enough a large tensioning force was not required for its 12 ft length, and no insulating separator discs were used. However it was noted that for longer lengths (~35 ft) insulating separator discs may be required. A small fixed length (~6 ft) of cable (calibration cable 502) with the same characteristic impedance (~130 ohms) as the connector/air interface was connected to the top of the probe 106 to extend the time between reflected impedance mismatch Pulses #1 and #2 so that the time interval between these pulses could be measured more precisely.

A 1000 feet length of low loss coaxial cable 118 with 50 ohm characteristic impedance (made by Times Microwave) was used to connect the probe 106 (with 6 ft calibration cable 502) to the TDR instrumentation electronics. An electronics circuit 504 including a special TDR electronic card which is compatible with the standard GEH NUMAC electronics was designed with an impulse generator and discriminator circuits to detect and measure the time interval between the reflected impedance mismatch Pulses #1 and #2 for automatic water level measurement. The time interval was measured by measuring the voltage of a voltage ramp (using a capacitor charging circuit) which starts when the discriminator detects the large positive reflected impedance mismatch pulse (Pulse #1) at the top of the probe, and stops when the discriminator detects the large negative reflected impedance mismatch pulse (Pulse #2) at the air/water interface in the probe 106. The measured voltage was then digitized and converted to counts which were converted back to water level and displayed on the NUMAC display.

A special optically clear plastic tube (~6 inches diameter, 12 ft high) was made to house the probe 106 and in which water level could be varied to simulate water level in the SFP. For the test, the probe 106 was inserted vertically into this tube and pulse TDR measurements were conducted by raising or lowering the water level to span the full 12 ft length of the probe. The test was conducted in the GEH laboratory. Pulse TDR measurement tests were conducted with both Stainless Steel and Aluminum Probes. Both probes provided approximately the same results. The results for stainless steel are shown in Table 2 and graphed in FIG. 5B.

TABLE 2

| Water Level | | Time between Pulses |
|---|---|---|
| ft from bottom | ft from top | Ramp Voltage (counts) |
| 11 | 1.0 | 1093 |
| 10.5 | 1.5 | 1182 |
| 10 | 2.0 | 1281 |
| 9.5 | 2.5 | 1361 |
| 9 | 3.0 | 1423 |
| 8.5 | 3.5 | 1485 |
| 8 | 4.0 | 1550 |
| 7.5 | 4.5 | 1614 |
| 7 | 5.0 | 1687 |
| 6.5 | 5.5 | 1756 |
| 6 | 6.0 | 1822 |
| 5.5 | 6.5 | 1887 |

TABLE 2-continued

| Water Level | | Time between Pulses |
|---|---|---|
| ft from bottom | ft from top | Ramp Voltage (counts) |
| 5 | 7.0 | 1960 |
| 4.5 | 7.5 | 2020 |
| 4 | 8.0 | 2077 |
| 3.5 | 8.5 | 2137 |
| 3 | 9.0 | 2205 |
| 2.5 | 9.5 | 2268 |
| 2 | 10.0 | 2329 |
| 1.5 | 10.5 | 2381 |
| 1 | 11 | 2433 |

These results show that with this TDR electronic card design in the NUMAC chassis, the reflected impedance mismatch Pulses #1 and #2 can be accurately detected by the discriminators and the time between them can be accurately measured so that after calibration the instrument can automatically provide accurate measure of water level. As expected, the time interval between the pulses is linearly proportional to the water level. There is a slight non-linearity specifically when the water level is close to probe top because of slight loss of pulse width resolution due to width of the pulse. The observed non-linearity can be reduced by using a narrower incident pulse. Note however, the presence of this non-linearity is not a critical problem because it can be accounted for in the calibration. Results indicate that for this NUMAC instrument, once the electronic circuits are temperature stabilized, the accuracy of the water level measurement would be better than ~1 inch.

The following is a summary of the various features and advantages of the disclosed Remote Pulse TDR water level measurement system, although it should be understood that the following is not an exhaustive list. The electronics can be located remotely at a far distance (up to 1000 feet or more) from the water level probe. The water level probe is completely passive with no moving parts or active electric or electronic circuitry in or around the probe. The rugged and relatively simple water level probe design is not susceptible to hostile radiation and post-accident environmental or water quality conditions. Once installed the water level probe calibration is fixed, and periodic full length probe calibration is not required. Verification of probe calibration can be performed at any time by manually moving the probe up and down a few feet. Electronics can be periodically calibrated for drift by using an external electronics calibration source. The system provides accurate level measurements (~1 inch) in pre-boiling and boiling water conditions. The system uses fast discriminators and provides automatic water level measurement with indicated water level output in feet (or other units). The system provides continuous water level monitoring as the water level changes over the full length of probe. The length of the probe is arbitrary and can extend to the bottom of the SFP. The probe can be mounted using a Ball and Socket arrangement so that attachment to the walls of the SFP is not required, and installation can be performed without radiation hazard. The system has low power consumption—approximately 30 watts for normal operation, ~20 watts in the screen save mode, and ~30 watts for a few minutes during on-demand mode. The instrument can be operated with a portable battery pack under SBO conditions. Very low power (<milliwatt) to the probe due to narrow (<10 nsec) pulses of a few volts amplitude every 10-100 microseconds. The system is not sensitive to water quality and can be used for water level measurement in SFP with salt water, borated water, and other open tanks with other kinds of waters or liquids. The system can be easily integrated with commercially available thermocouples (or RTDs) if SFP temperature measurements are required. The system can provide rate of change of water level and temperature and integrated SFP temperature/water level information as required in the event of an accident. All measured and computed data can be transmitted to other SFP monitoring stations as required.

The present disclosure describes a unique remote pulse TDR instrumentation system which can be used to determine water level in the spent fuel pool (SFP) of a nuclear reactor from a remote distance (up to 1000 feet or more). The method is suitable for continuous post-accident SFP water level monitoring from a remote location when personnel may not be able to access the spent fuel pool area due to high radiation or plant damage from the accident. The probe and cable are rugged and resistant to post-accident radiation and environmental conditions, and the system design allows the electronics to be located in a protected area far from the reactor. The described remote pulse TDR measurement uses relatively little power and can be powered by a portable battery, so is well suited for post-accident monitoring under station blackout (SBO) conditions.

Although the present disclosure focuses on spent fuel water level monitoring in a nuclear reactor, it should be understood that the systems and methods herein can be adapted with relative ease to measure water level remotely in the reactor pressure vessel (RPV) during normal reactor operation and after an accident. Such a system would provide a diverse RPV water level measurement, and that could increase overall reliability for normal and post-accident monitoring. Furthermore, the systems and methods herein are also applicable to non-nuclear settings involving various types of liquids.

While a number of example embodiments have been disclosed herein, it should be understood that other variations may be possible. Such variations are not to be regarded as a departure from the spirit and scope of the present disclosure, and all such modifications as would be obvious to one skilled in the art are intended to be included within the scope of the following claims.

The invention claimed is:

1. A system for measuring a water level, comprising:
a probe including a conductive rod and insulating spacers within a conductive tube, the conductive rod arranged coaxially within the conductive tube, the conductive rod extending through the insulating spacers, the conductive tube including perforations exposing the conductive rod and the insulating spacers within;
a head connector connected to the probe;
a coaxial cable connected to the head connector, the coaxial cable including an inner conducting wire within an outer conducting shield and separated by an inner insulator, the inner conducting wire and the outer conducting shield of the coaxial cable being in electrical communication with the conductive rod and the conductive tube of the probe, respectively, via the head connector;
a pulsing unit connected to the coaxial cable, the pulsing unit configured to transmit a narrow pulse to the probe and to receive a positive first reflected pulse and a negative second reflected pulse therefrom via the coaxial cable, the positive first reflected pulse being from a head connector/air interface, the negative second reflected pulse being from an air/water interface of the water level, the pulsing unit configured to calculate a time between the positive first reflected pulse and the negative second reflected pulse and to convert the time to a distance that is indicative of the water level; and a calibration cable connecting the head connector to the coaxial cable, the calibration cable having an impedance that is higher than the coaxial cable but equal to that of the head connector, the calibration cable having a length less than that of the probe.

2. The system of claim 1, wherein the probe has a length that exceeds a depth corresponding to the water level.

3. The system of claim 1, wherein the conductive rod includes a core made of a first material and a shell surrounding the core, the shell made of a second material, a conductivity of the second material being greater than that of the first material.

4. The system of claim 3, wherein the second material is gold.

5. The system of claim 1, wherein the conductive rod extends through a center of each of the insulating spacers.

6. The system of claim 1, wherein the insulating spacers are in the form of discs.

7. The system of claim 1, wherein the insulating spacers are made of at least one of ceramic, quartz, glass, and porcelain.

8. The system of claim 1, wherein the insulating spacers are positioned at regular intervals along the conductive rod.

9. The system of claim 1, wherein each of the insulating spacers has a thickness less than 0.125 inches.

10. The system of claim 1, wherein the conductive tube is made of stainless steel.

11. The system of claim 1, wherein the perforations are included along every inch of an entire length of the conductive tube.

12. The system of claim 1, wherein a ratio of an inner diameter of the conductive tube to an outer diameter of the conductive rod ranges from 10 to 20.

13. The system of claim 1, wherein an outer surface of the conductive rod is equidistantly spaced from an inner surface of the conductive tube.

14. The system of claim 1, wherein the head connector includes a center conductor connection and an outer conductor connection, the center conductor connection of the head connector being in electrical communication with the conductive rod of the probe and the inner conducting wire of the coaxial cable, the outer conductor connection of the head connector being in electrical communication with the conductive tube of the probe and the outer conducting shield of the coaxial cable.

15. The system of claim 1, wherein the coaxial cable has an impedance of 75 ohms or less.

16. The system of claim 1, wherein the pulsing unit is located remotely from the probe at a distance of at least 500 feet.

17. A method of measuring a water level, comprising:
connecting a head connector to a probe and a coaxial cable, a calibration cable connecting the head connector to the coaxial cable, the calibration cable having an impedance that is higher than the coaxial cable but equal to that of the head connector, the calibration cable having a length less than that of the probe;
inserting the probe into a body of water, the probe having a probe/air interface, the body of water including an air/water interface;
transmitting a narrow pulse to the probe;
receiving a first impedance mismatch from the probe/air interface in a form of a positive reflected pulse;
receiving a second impedance mismatch from the air/water interface in a form of a negative reflected pulse;
calculating a time between the positive reflected pulse and the negative reflected pulse; and
converting the time to a distance, the distance being indicative of the water level.

18. The method of claim 17, further comprising:
performing a calibration by independently determining the water level and correlating the time and resulting distance to the independently determined water level.

19. The method of claim 17, wherein the inserting includes positioning the probe vertically in the body of water.

20. The method of claim 17, wherein the inserting includes situating the probe in a post-accident nuclear environment 21. The method of claim 17, wherein the transmitting includes a narrow pulse with rise and fall times totaling 10 nanoseconds or less.

22. The method of claim 17, wherein the transmitting includes sending the narrow pulse through a coaxial cable over a distance of at least 500 feet to the probe.

23. The method of claim 17, wherein the receiving a positive reflected pulse includes a first low-to-high impedance mismatch of at least 50 ohms.

24. The method of claim 17, wherein the receiving a negative reflected pulse includes a second high-to-low impedance mismatch of at least 100 ohms.

* * * * *